United States Patent
Yang

(10) Patent No.: US 9,018,643 B2
(45) Date of Patent: Apr. 28, 2015

(54) GAN LEDS WITH IMPROVED AREA AND METHOD FOR MAKING THE SAME

(71) Applicant: Kabushiki Kaisha Toshiba, Tokyo (JP)

(72) Inventor: Long Yang, Livermore, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 34 days.

(21) Appl. No.: 14/026,556

(22) Filed: Sep. 13, 2013

(65) Prior Publication Data

US 2014/0167082 A1    Jun. 19, 2014

Related U.S. Application Data

(63) Continuation of application No. 13/226,404, filed on Sep. 6, 2011, now Pat. No. 8,558,247.

(51) Int. Cl.
| | |
|---|---|
| H01L 27/15 | (2006.01) |
| H01L 29/267 | (2006.01) |
| H01L 31/12 | (2006.01) |
| H01L 33/00 | (2010.01) |
| H01L 33/24 | (2010.01) |
| H01L 33/40 | (2010.01) |

(52) U.S. Cl.
CPC ............ *H01L 33/24* (2013.01); *H01L 33/0079* (2013.01); *H01L 33/0095* (2013.01); *H01L 33/405* (2013.01)

(58) Field of Classification Search
None
See application file for complete search history.

(56) References Cited

U.S. PATENT DOCUMENTS

| | | |
|---|---|---|
| 5,306,662 A | 4/1994 | Nakamura et al. |
| 5,408,120 A | 4/1995 | Manabe et al. |
| 5,468,678 A | 11/1995 | Nakamura et al. |
| 5,563,422 A | 10/1996 | Nakamura et al. |
| 5,578,839 A | 11/1996 | Nakamura et al. |
| 5,734,182 A | 3/1998 | Nakamura et al. |
| 5,747,832 A | 5/1998 | Nakamura et al. |
| 5,753,939 A | 5/1998 | Sassa et al. |
| 5,777,350 A | 7/1998 | Nakamura et al. |
| 5,959,307 A | 9/1999 | Nakamura et al. |

(Continued)

FOREIGN PATENT DOCUMENTS

| | | |
|---|---|---|
| JP | 2626431 | 5/1994 |
| JP | 2681733 | 5/1994 |

(Continued)

OTHER PUBLICATIONS

Japanese Office Action dated Dec. 22, 2014, corresponding to Japanese Application No. 2014-527364. English Translation.

(Continued)

*Primary Examiner* — Sonya D McCall Shepard
(74) *Attorney, Agent, or Firm* — Hogan Lovells US LLP

(57) ABSTRACT

Enlightening device and method for making the same are disclosed. Individual light emitting devices such as LEDs are separated to form individual dies by process in which a first narrow trench cuts the light emitting portion of the device and a second trench cuts the substrate to which the light emitting portion is attached. The first trench can be less than 10 μm. Hence, a semiconductor area that would normally be devoted to dicing streets on the wafer is substantially reduced thereby increasing the yield of devices. The devices generated by this method can also include base members that are electrically conducting as well as heat conducting in which the base member is directly bonded to the light emitting layers thereby providing improved heat conduction.

19 Claims, 10 Drawing Sheets

(56) References Cited

U.S. PATENT DOCUMENTS

| | | | |
|---|---|---|---|
| 5,959,401 | A | 9/1999 | Asami et al. |
| 6,005,258 | A | 12/1999 | Manabe et al. |
| 6,040,588 | A | 3/2000 | Koide et al. |
| RE36,747 | E | 6/2000 | Manabe et al. |
| 6,215,133 | B1 | 4/2001 | Nakamura et al. |
| 6,265,726 | B1 | 7/2001 | Manabe et al. |
| 6,326,236 | B1 | 12/2001 | Koide et al. |
| 6,420,733 | B2 | 7/2002 | Koide et al. |
| 6,541,293 | B2 | 4/2003 | Koide et al. |
| 6,610,995 | B2 | 8/2003 | Nakamura et al. |
| 6,657,236 | B1 | 12/2003 | Thibeault et al. |
| 6,800,500 | B2 | 10/2004 | Coman et al. |
| 6,838,693 | B2 | 1/2005 | Kozaki |
| 6,849,881 | B1 | 2/2005 | Harle et al. |
| 6,891,197 | B2 | 5/2005 | Bhat et al. |
| 6,906,352 | B2 | 6/2005 | Edmond et al. |
| 6,916,676 | B2 | 7/2005 | Sano et al. |
| 6,951,695 | B2 | 10/2005 | Xu et al. |
| 6,977,395 | B2 | 12/2005 | Yamada et al. |
| 7,026,653 | B2 | 4/2006 | Sun |
| 7,106,090 | B2 | 9/2006 | Harle et al. |
| 7,115,908 | B2 | 10/2006 | Watanabe et al. |
| 7,138,286 | B2 | 11/2006 | Manabe et al. |
| 7,193,246 | B1 | 3/2007 | Tanizawa et al. |
| 7,262,436 | B2 | 8/2007 | Kondoh et al. |
| 7,312,474 | B2 | 12/2007 | Emerson et al. |
| 7,335,920 | B2 | 2/2008 | Denbaars et al. |
| 7,345,297 | B2 | 3/2008 | Yamazoe et al. |
| 7,348,602 | B2 | 3/2008 | Tanizawa |
| 7,402,838 | B2 | 7/2008 | Tanizawa et al. |
| 7,442,966 | B2 | 10/2008 | Bader et al. |
| 7,446,345 | B2 | 11/2008 | Emerson et al. |
| 7,491,565 | B2 | 2/2009 | Coman et al. |
| 7,547,908 | B2 | 6/2009 | Grillot et al. |
| 7,611,917 | B2 | 11/2009 | Emerson et al. |
| 7,709,851 | B2 | 5/2010 | Bader et al. |
| 7,737,459 | B2 | 6/2010 | Edmond et al. |
| 7,754,514 | B2 | 7/2010 | Yajima et al. |
| 7,791,061 | B2 | 9/2010 | Edmond et al. |
| 7,791,101 | B2 | 9/2010 | Bergmann et al. |
| 7,795,623 | B2 | 9/2010 | Emerson et al. |
| 7,910,945 | B2 | 3/2011 | Donofrio et al. |
| 7,939,844 | B2 | 5/2011 | Hahn et al. |
| 7,947,994 | B2 | 5/2011 | Tanizawa et al. |
| 8,021,904 | B2 | 9/2011 | Chitnis |
| 8,030,665 | B2 | 10/2011 | Nagahama et al. |
| 2003/0116774 | A1 | 6/2003 | Yamamoto et al. |
| 2006/0243991 | A1 | 11/2006 | Liu |
| 2008/0121906 | A1 | 5/2008 | Yakushiji |
| 2010/0127237 | A1 | 5/2010 | Chang |
| 2010/0219437 | A1 | 9/2010 | Usuda et al. |

FOREIGN PATENT DOCUMENTS

| | | |
|---|---|---|
| JP | 2917742 | 6/1994 |
| JP | 2827794 | 8/1994 |
| JP | 2778405 | 9/1994 |
| JP | 2803741 | 9/1994 |
| JP | 2785254 | 1/1995 |
| JP | 2735057 | 3/1996 |
| JP | 2956489 | 3/1996 |
| JP | 2666237 | 12/1996 |
| JP | 2890396 | 12/1996 |
| JP | 3250438 | 12/1996 |
| JP | 3135041 | 6/1997 |
| JP | 3209096 | 12/1997 |
| JP | 3506874 | 1/1998 |
| JP | 3654738 | 2/1998 |
| JP | 3795624 | 2/1998 |
| JP | 3304787 | 5/1998 |
| JP | 3344257 | 8/1998 |
| JP | 3223832 | 9/1998 |
| JP | 3374737 | 12/1998 |
| JP | 3314666 | 3/1999 |
| JP | 4118370 | 7/1999 |
| JP | 4118371 | 7/1999 |
| JP | 3548442 | 8/1999 |
| JP | 3622562 | 11/1999 |
| JP | 3424629 | 8/2000 |
| JP | 4860024 | 8/2000 |
| JP | 3063756 | 9/2000 |
| JP | 4629178 | 9/2000 |
| JP | 3063757 | 10/2000 |
| JP | 3511970 | 10/2000 |
| JP | 3551101 | 5/2001 |
| JP | 3427265 | 6/2001 |
| JP | 3646649 | 10/2001 |
| JP | 3780887 | 5/2002 |
| JP | 3890930 | 5/2002 |
| JP | 2003174194 A | 6/2003 |
| JP | 3786114 | 4/2004 |
| JP | 4904261 | 6/2004 |
| JP | 2006108245 A | 4/2006 |
| JP | 2006-303034 A | 11/2006 |
| JP | 2007329234 A | 12/2007 |
| JP | 2009-130324 A | 6/2009 |
| JP | 2009260003 A | 11/2009 |
| JP | 2010114405 A | 5/2010 |
| JP | 2011082587 A | 4/2011 |

OTHER PUBLICATIONS

International Search Report, WO2013036482, Mar. 14, 2013, Corresponding PCT application.

International Search Report, PCT/US2012/053668 dated Jan. 30, 2013.

GAN LEDS WITH IMPROVED AREA AND METHOD FOR MAKING THE SAME

BACKGROUND OF THE INVENTION

Light emitting diodes (LEDs) are an important class of solid-state devices that convert electric energy to light. Improvements in these devices have resulted in their use in light fixtures designed to replace conventional incandescent and fluorescent light sources. The LEDs have significantly longer lifetimes and, in some cases, significantly higher efficiency for converting electric energy to light.

For the purposes of this discussion, an LED can be viewed as having three layers, the active layer sandwiched between two other layers. The active layer emits light when holes and electrons from the outer layers combine in the active layer. The holes and electrons are provided by passing a current through the LED. In one common configuration, the LED is powered through an electrode that overlies the top layer and a contact that provides an electrical connection to the bottom layer.

The cost of LEDs is an important factor in determining the rate at which this new technology will replace conventional light sources and be utilized in high-power applications. The cost of the LEDs is, in part, determined by the yield of the LEDs from the wafers on which they are constructed. In general, the wafer includes a large number of LEDs with each LED being separated from its neighboring LEDs by a dicing street. When the LEDs are separated from the wafer, cuts are made in the dicing street area thereby releasing individual dies. The size of the dicing streets is typically 100 μm. This area is basically wasted space. If the LEDs are large compared to the dicing streets, the overall percentage loss introduced by the dicing streets is relatively small, and hence, acceptable. Unfortunately, the ratio of the street dimensions to the LED dies is significant in many LED applications. For example, the losses inherent in a 1 mm die introduced by the dicing streets results in a 20 percent loss of area on the wafer. In many applications, dies that are as small as a half a millimeter are required. In these cases the losses are even worse.

Accordingly, it would be advantageous to provide a dicing scheme in which the dicing streets are smaller. Unfortunately dicing schemes that depend on mechanical cutting or laser scribing are limited to dicing streets of the order of 50 μm. Furthermore schemes that depend on etching the underlying wafer are also limited by the thickness of the wafer, since the aspect ratio of the width of a trench to the depth of the trench is limiting.

In addition, the time required to dice a wafer having a large number of small dies on the wafer is significant. Since the processing time increases the cost of the dies, a dicing scheme in which all of the dies are released at once would be advantageous.

SUMMARY OF THE INVENTION

The present invention includes a light emitting device and a method for making same. The light emitting device includes an active layer sandwiched between first and second semiconductor layers of opposite types, the active layer emitting light of a predetermined wavelength when holes and electrons combine therein. A mirror layer is in contact with a surface of the second semiconductor layer that is not in contact with the active layer, the mirror having a surface area substantially equal to that of the active layer. This structure is bonded to a base member having a first surface in contact with the mirror layer and having an area substantially equal to that of the mirror layer. The base member has a cross-sectional area at locations distal from the first surface that is less than the area of the first surface. The base member can be electrically conductive and provide one power terminal for powering the device as well as a good heat conducting path for removing heat from the active layer and first and second semiconductor layers.

The device is constructed by epitaxially growing a light emitting layer on a first substrate, the light emitting layer including an active layer sandwiched between first and second semiconductor layers of opposite types. The active layer emits light of a predetermined wavelength when holes and electrons combine therein. A reflective layer is deposited on the surface of an exposed surface of one of the semiconductor layers. The reflective layer is bonded to a first surface of a second substrate. The first substrate is then removed leaving the remaining structure bonded to the second substrate. A first trench is cut through this structure. A second trench is cut through the second substrate from the surface that is not bound to the structure. The combination of the two trenches allows dies having the light emitting devices to be separated.

DETAILED DESCRIPTION OF THE PREFERRED EMBODIMENTS OF THE INVENTION

Figure 1:
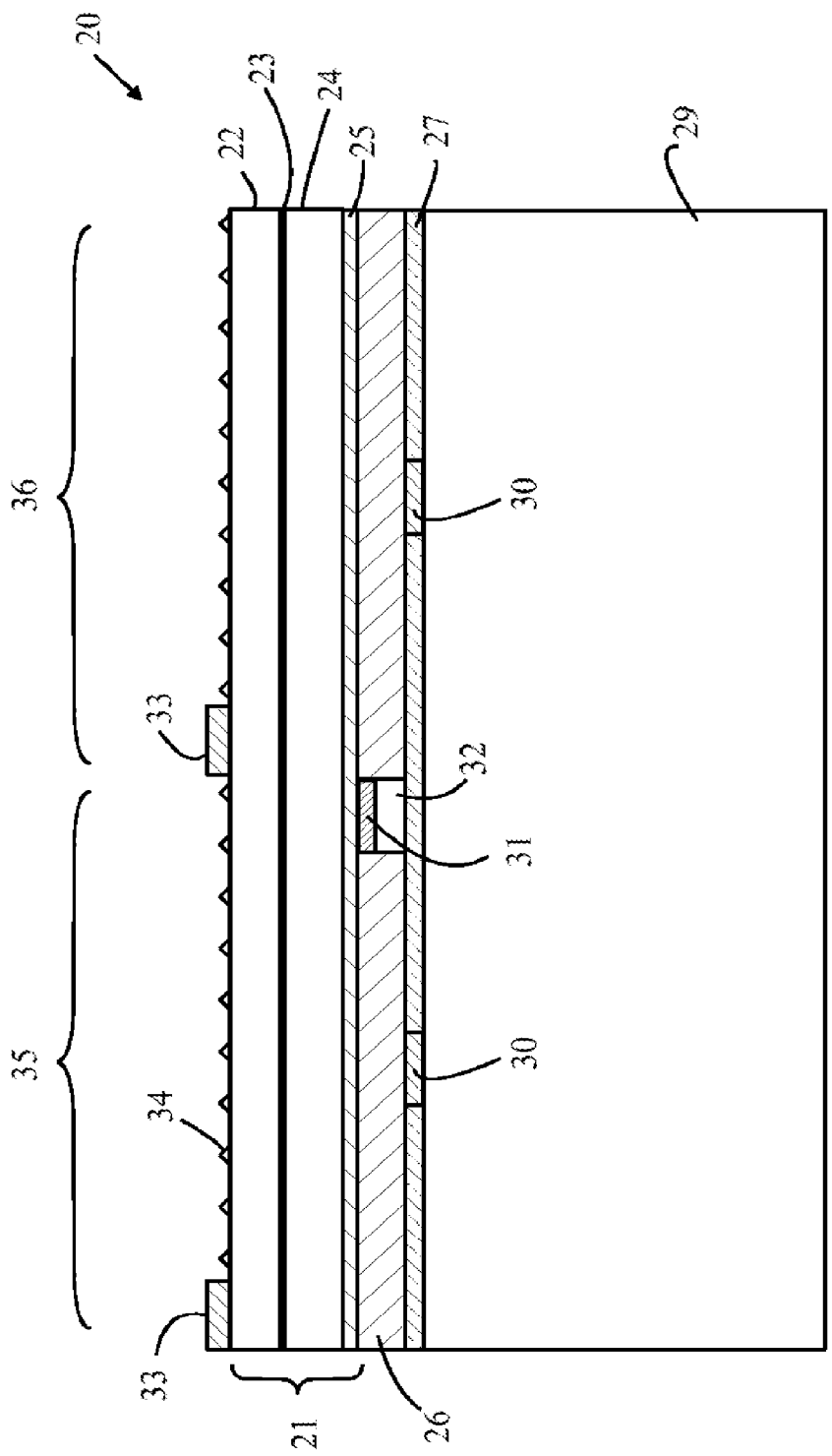
FIG. 1 is a cross-sectional view of a multi-LED carrier prior to the operations used to the divide carrier into individual LED light sources.
Figure 2:
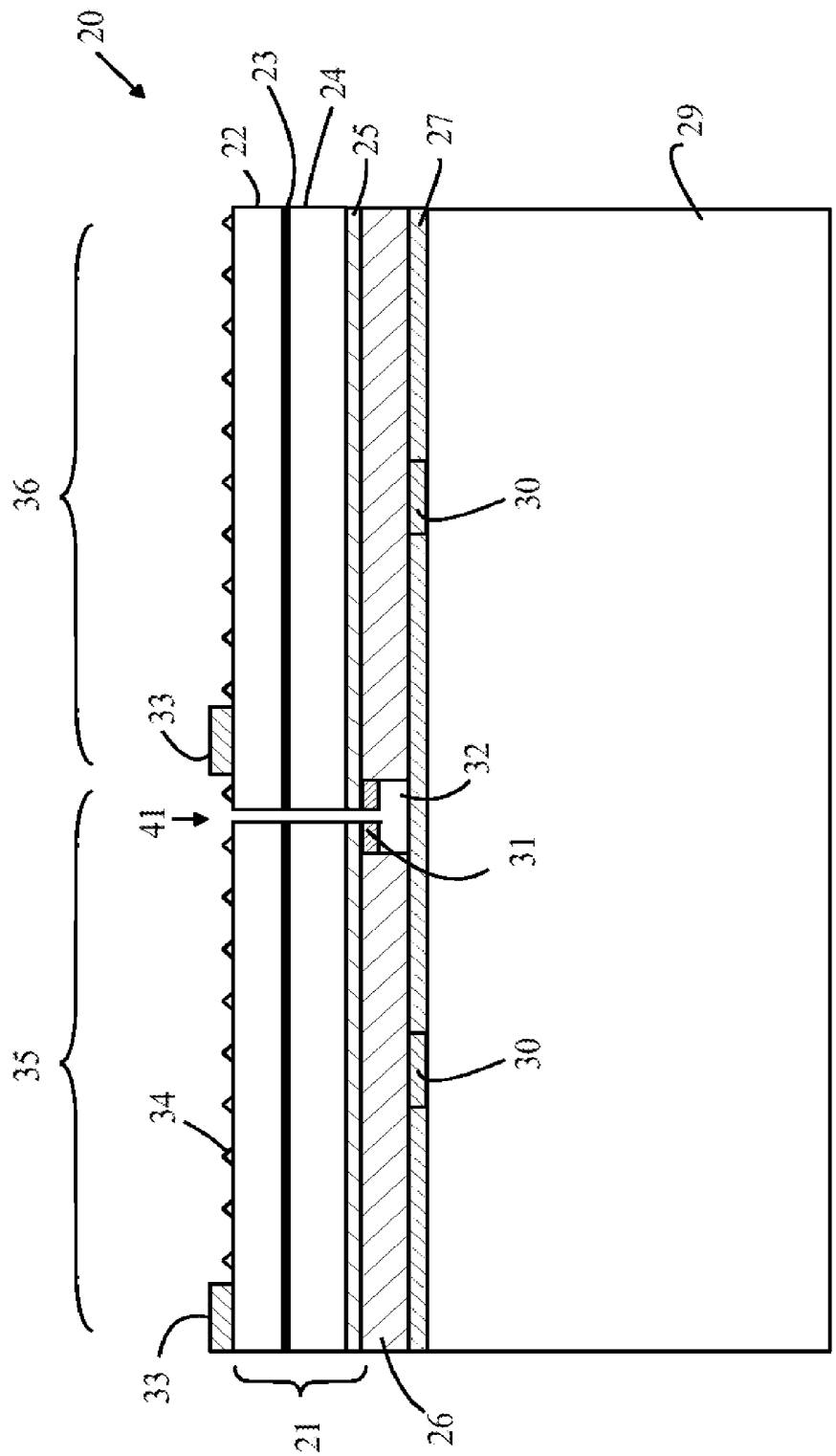
FIG. 2 illustrates the carrier after a first trench is formed in the process of singulating the individual dies.
Figure 3:
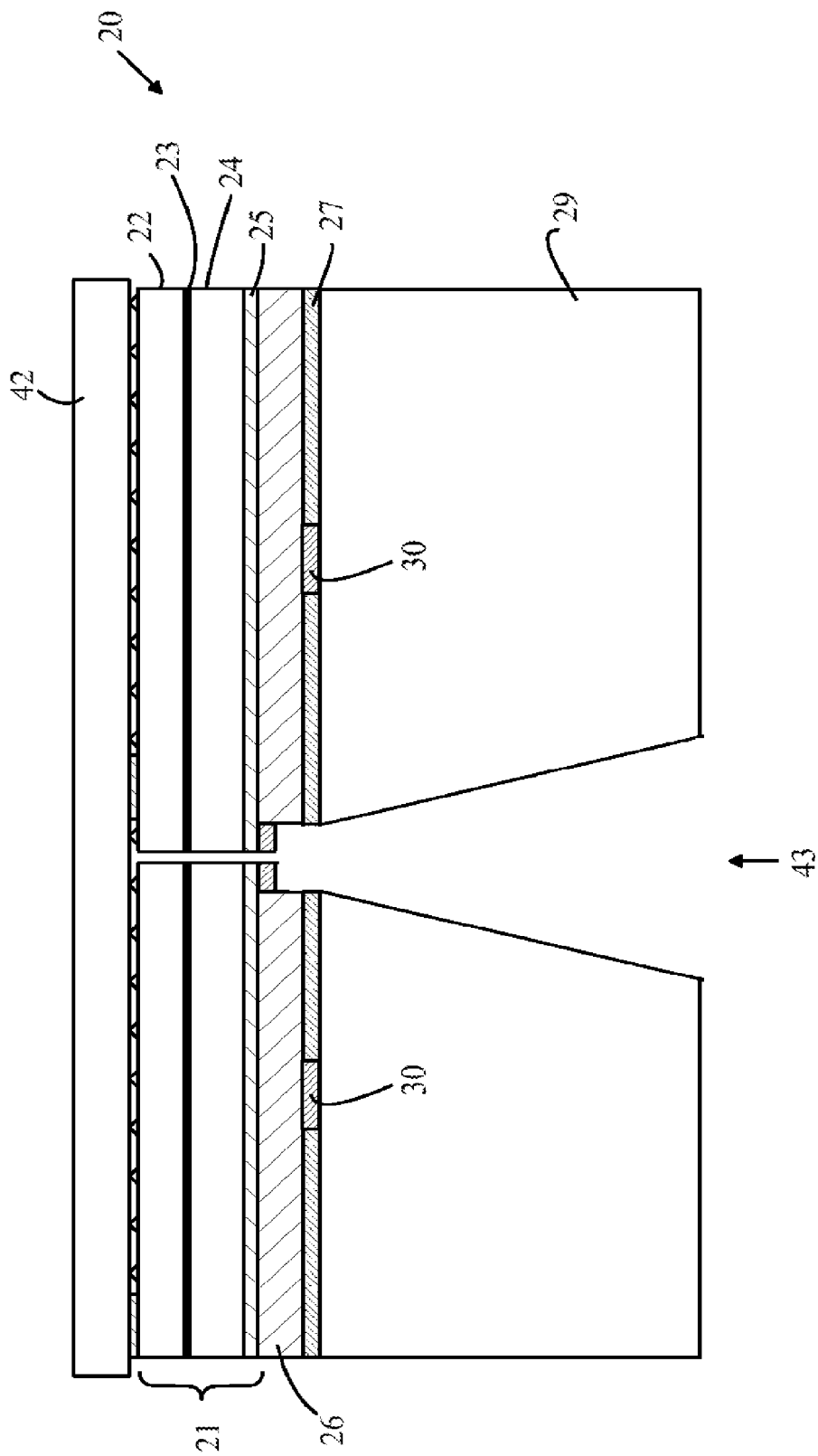
FIG. 3 illustrates the carrier after a second trench is formed in the process of singulating the individual dies.

The manner in which the present invention provides its advantages can be more easily understood with reference to FIGS. 1-3, which are cross-sectional views of a portion of a multi-LED carrier 20. FIG. 1 is a cross-sectional view of multi-LED carrier 20 prior to the operations used to divide carrier 20 into individual LED light sources. The portion of carrier 20 shown in the figures includes two LED light sources 35 and 36; however, it is to be understood that an actual production wafer would have hundreds or thousands of dies. The LED light sources are constructed from a three layer gallium nitrate structure and a metal layer shown at 21. Structure 21 includes an n-CaN layer 22, an active layer 23, and the p-GaN layer 24. The individual LED light sources are powered by applying the appropriate potential between contact 33 and a conductive substrate 29. Light generated in active layer 23 exits the devices through a roughened surface shown at 34. The highly reflective metal layer 25 forms a mirror that reflects light traveling in the downward direction back towards surface 34. Here, the term of GaN layer is used to refer a general alloy system of AlGaInN materials. The three semiconductor layers shown at 21 will be referred to as the "LED layers" in the following discussion.

While the embodiments shown in FIG. 1 utilize three layers as described above, it is to be understood that each of these layers may include a plurality of sub-layers. To simplify the discussion, these sub-layers have been omitted, since they are not critical to an understanding of the present invention.

Structure 21 is bonded to a conducting substrate 29 having an insulating layer 27 on the upper surface thereof. In this embodiment, the bonding is provided by a eutectic metal layer 26. Conducting metal filled vias 30 provide electrical connections between substrate 29 and eutectic metal layer 26. Eutectic metal layer 26 includes a gap 32 between each of the light sources that are eventually going to be separated out of carrier 20. An insulating pad 31 occupies the upper portion of this gap.

Carrier 20 will be referred to as a precursor carrier in the following discussion, since the individual light sources are created by dividing carrier 20 into individual dies. Carrier 20 is divided into individual light sources in a two-step process. Referring now to FIG. 2 which illustrates carrier 20 after the first step has been carried out. In the first step, a narrow trench 41 is etched through the LED layers including the gallium nitrite layers, metal layer 25 and through pad 31. Trench 41 determines the final size of each LED light source's light emitting area. Hence, the amount of area lost in the singulation process is substantially reduced if the width of trench 41 is less than the conventional dicing street widths discussed above.

It should be noted that FIG. 2 is not drawn to scale with respect to the thickness of the various layers. In particular it should be noted that the layers shown at 21 are typically of the order of 5 μm, while substrate 29 has a thickness of a few hundred microns. Trench 41 is preferably cut using a dry etch process. The portion of trench 41 that passes through the GaN layers can be cut using $Cl_2$-based chemistry which will stop on the $SiO_2$ layer. The $SiO_2$ layer can then be removed by switching to $F_2$-based chemistry.

The aspect ratio of the trench is defined to be the depth of the trench divided by the width of the trench. For dry etch processes, aspect ratios greater than one can be achieved. Accordingly, the width of trench 41 can be made less than the thickness of the LED layers. For example, trench 41 can be held to a width of less than 10 μm. In another aspect of the invention, trench 41 is less than 5 μm. Thus, the area of the GaN that is lost in the singulation process is reduced by an order of magnitude compared to conventional dicing methods.

The present invention is based on the observation that while substrate 29 cannot be segmented by digging a trench that is limited to the same width because of the much greater thickness of substrate 29, removing some excess material from substrate 29 does not have a substantial effect on the light produced by the LED light sources or the mechanical strength of the light sources.

Refer now to FIG. 3, which illustrates the removal of a portion of a substrate 29 to free the individual light sources from precursor carrier 20. Initially, carrier 20 is attached to a second carrier 42 which is often referred to as blue tape. Carrier 42 immobilizes the various light sources once they are separated from carrier 20. After carrier 20 is attached to carrier 42, a second trench is etched from the bottom side of substrate 29 as shown at 43. Due to the thickness of substrate 29, the width of this trench on the bottom surface of substrate 29 will, in general, be significantly wider than the width of the trench at the point at which it passes through layer 27. However this increased width does not cause difficulties since it is far from the active region of the light sources. The resulting light sources can be viewed as having a light generating layer that includes the LED layers and a base member in which the base member has a first width proximate to the light generating layer and a second width that is distal from the light generating layers, the second width being less than the first width.

Trench 43 could be generated by any means that allows substrate 29 to be cut at the appropriate position without leaving an overhanging portion of the active layers that is sufficient to result in the active layers breaking off. In one aspect of the present invention, this trench is provided by photolithographic etching of substrate 29. This method has the advantage of singulating all of the dies simultaneously. In principle, trench 43 could be generated utilizing a dicing saw or laser scribing. However these methods take substantially longer to complete, particularly in cases in which precursor carrier 20 is divided into a very large number of small dies.

In one aspect of the present invention, layer 24 is the p-GaN layer and layer 22 is the n-GaN layer. The face of layer 22 through which light exits is roughened to improve the extraction of light from the light source. The surface is etched or lithographically patterned to provide scattering features having dimensions greater than, or of the order of, the wavelength of light that is generated in the active layer. This face is an N-face of the GaN crystal. Since the N-face is substantially easier to etch than the Ga face that is presented for etching in conventional arrangements in which the p-GaN layer is on the top, these embodiments provide additional advantages if the outer surface is to be roughened.

Figure 4:
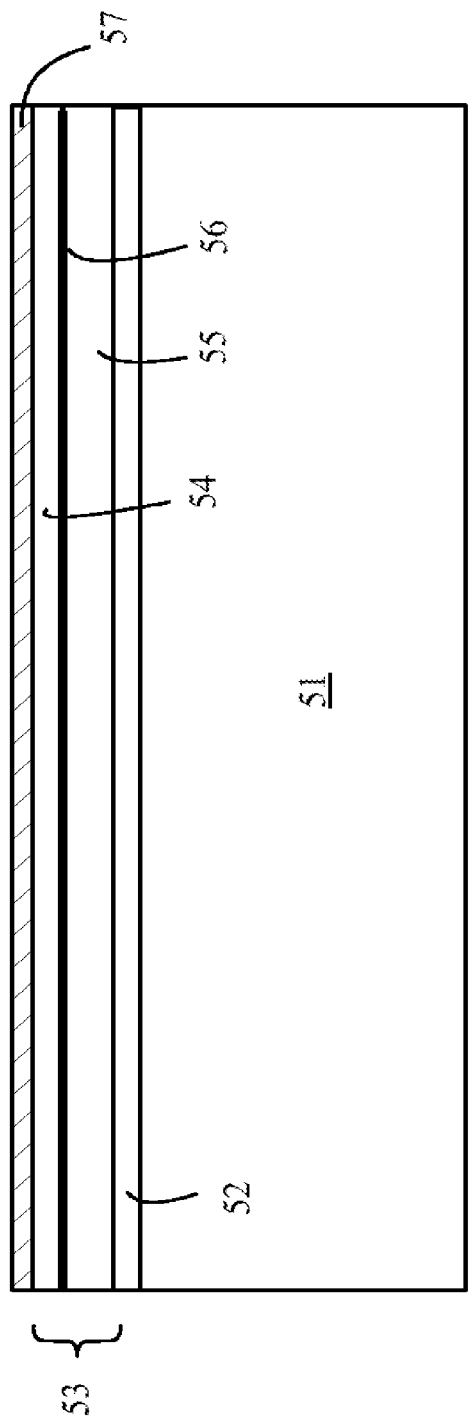
FIGS. 4-7 illustrate the fabrication process for generating light sources according to the present invention.

One method for generating a structure such as that shown in FIG. 1 will now be discussed in more detail with reference to FIGS. 4-7, which illustrate the fabrication process for generating light sources according to the present invention. Refer now to FIG. 4. Initially, a number of layers are grown epitaxially on a substrate 51. These layers include the LED layers discussed above, namely, an n-GaN buffer layer 52, and LED structure 53 consisting of an n-GaN layer 55, an active layer 56, and a p-GaN layer 54. Finally a layer 57 of highly reflective metal such as silver is deposited on layer 54. It should be noted that layer 57 may include a protective layer to isolate the silver from layers that are subsequently deposited thereon.

Figure 5:
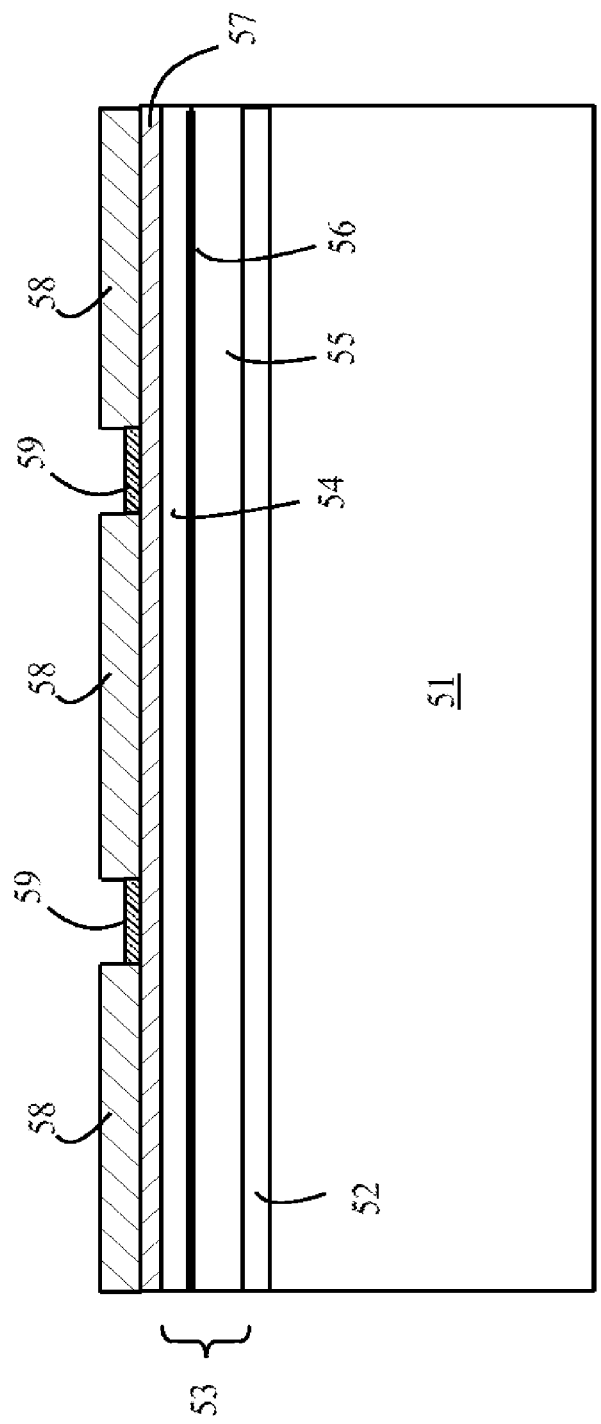

Refer now to FIG. 5. Next, a plurality of bonding pads 58 separated by insulating regions 59 are generated on the surface of layer 57. In one aspect of the invention, the bonding pads comprise a eutectic metal and the insulating pads are constructed from materials such as SiO, that will not be wet by the bonding pad material during the subsequent bonding operations. It should be noted that the thickness of insulating pads 59 together with the thickness of LED structure 53 determines the thickness of the light generating structure and the width of the base member discussed above. The strength of the light emitting structure can be increased by increasing the thickness of region 59; however, this increases the thickness of the structure that must be trenched to form trenches 41 discussed above.

Figure 6:
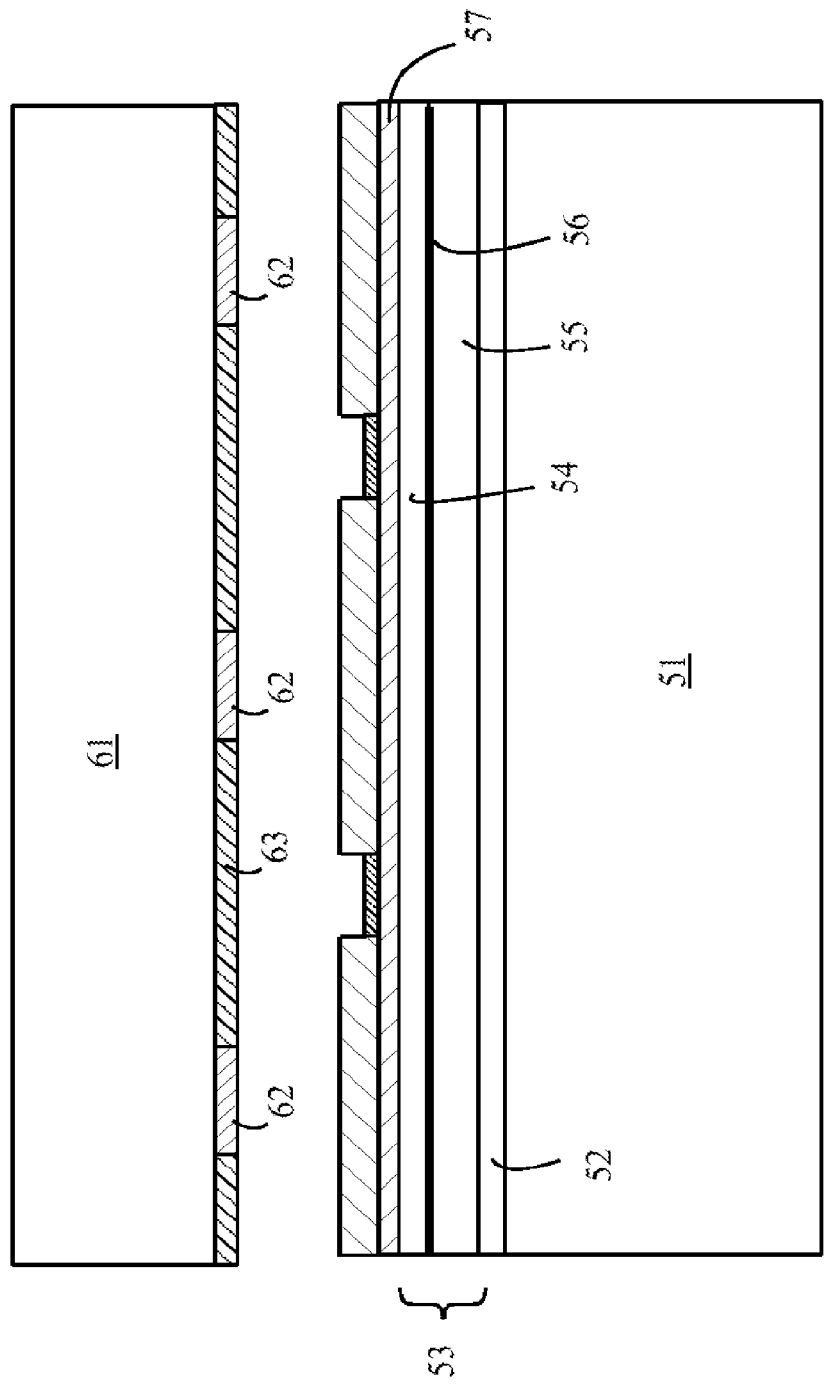

Refer now to FIG. 6. Next, a second substrate 61 having an insulating $SiO_2$, layer 63 with adhesion pads 62 positioned thereon is positioned over wafer 51. The adhesion pads are constructed from a metal that will bond with the eutectic metal pads discussed above. In one aspect of the invention, substrate 61 is a silicon wafer. In one embodiment of the present invention, substrate 61 becomes the base member discussed above.

Figure 7:
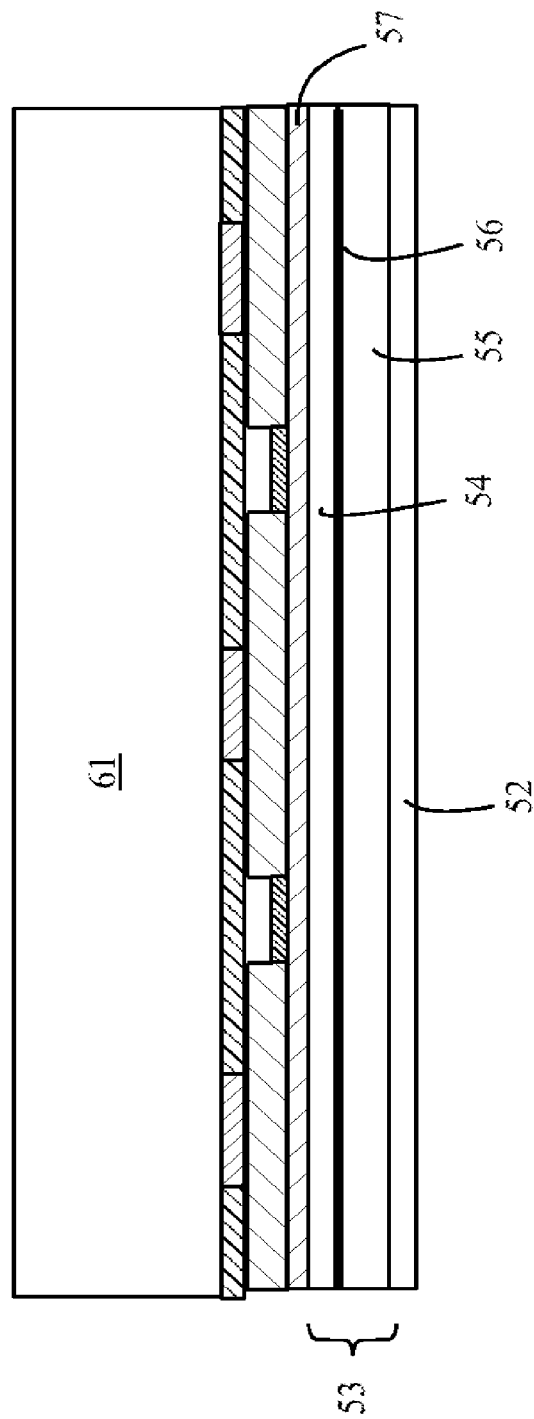

Refer now to FIG. 7. Substrate 61 is then pressed against the outer layer on substrate 51 and the two substrates are heated to allow the eutectic metal to bond with the adhesion pads on substrate 61. Substrate 51 is then removed by etching or polishing. Buffer layer 52, which is an n-GaN layer can then be roughened to provide the scattering surface discussed above finally, the contact pads discussed above are patterned on the roughened layer to arrive at a structure analogous to that shown in FIG. 1.

Refer again to FIG. 3. In the above-described embodiments, the final base member such as that shown in FIG. 3 was constructed from silicon. Silicon provides good heat conduction and is easily handled in conventional fabrication lines. The light absorption issues with respect to silicon are removed by the presence of the mirror 25. Since the silicon wafer does not include any semiconductor devices, inexpensive silicon wafers can be utilized for wafers. However, it would be advantageous to provide an even better heat conductor as the final mounting substrate.

Figure 8:
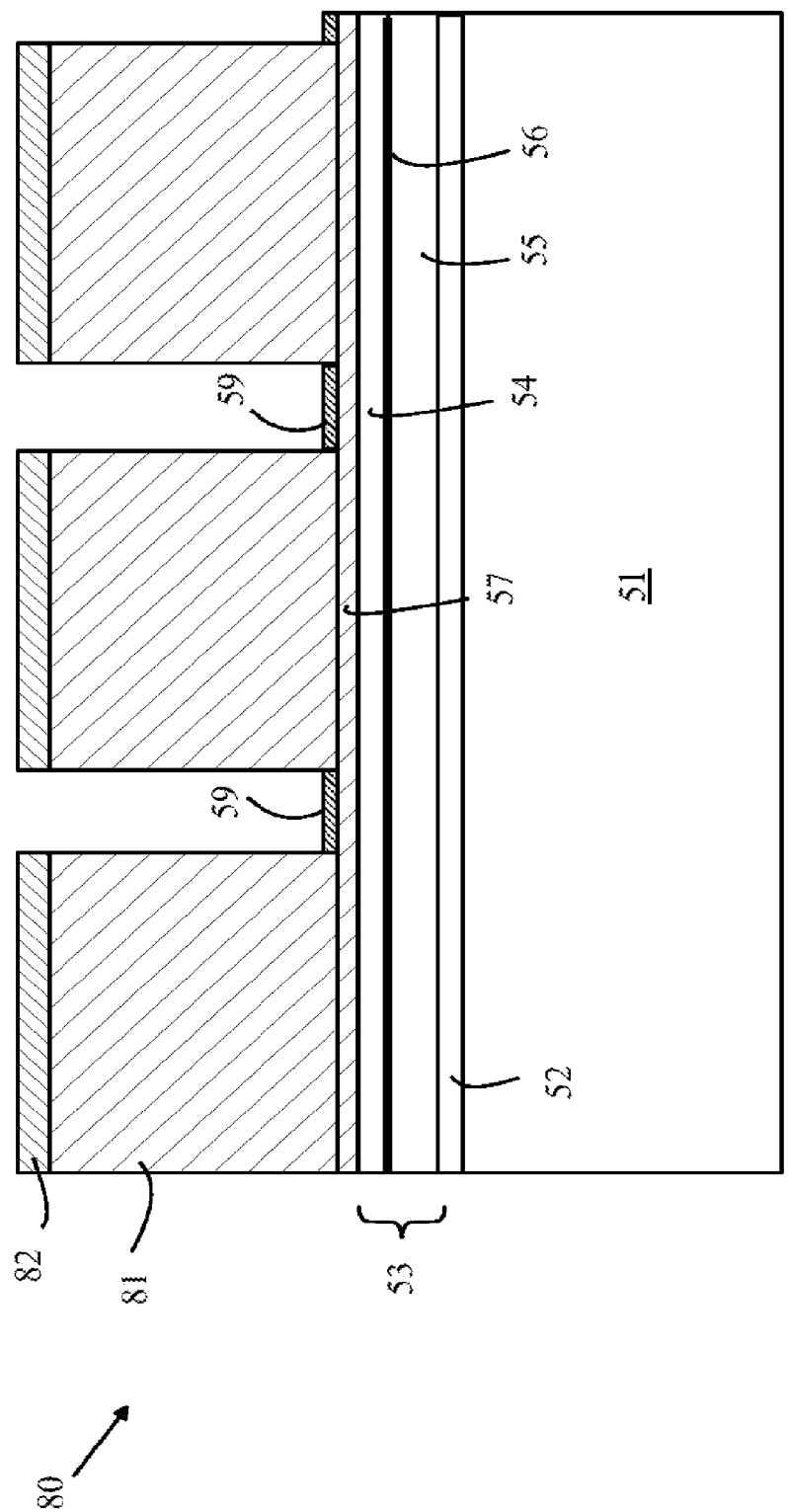
FIGS. 8-9 illustrate another embodiment of a light source according to the present invention.

Refer now to FIG. 8, which is a cross-sectional view of a portion of a wafer at a fabrication stage analogous to that shown in FIG. 5. In this embodiment, a thick layer 81 of a suitable metal is plated onto the top surface of mirror layer 57 prior to plating the eutectic metal layer 82. Layer 81 can be constructed from any metal that has good thermal and electrical conductivity and suitable mechanical strength. For example, layer 81 could be fabricated from copper or nickel. The thickness of layer 81 is typically of the order of 100 μm. Layer 81 is patterned to provide gaps that serve the function of the bottom trenches used for the final division of the wafer into individual dies. In one aspect of the invention, the gap between the metal pads is approximately 50 μm. These gaps are analogous to trench 43 shown in FIG. 3.

Figure 9:
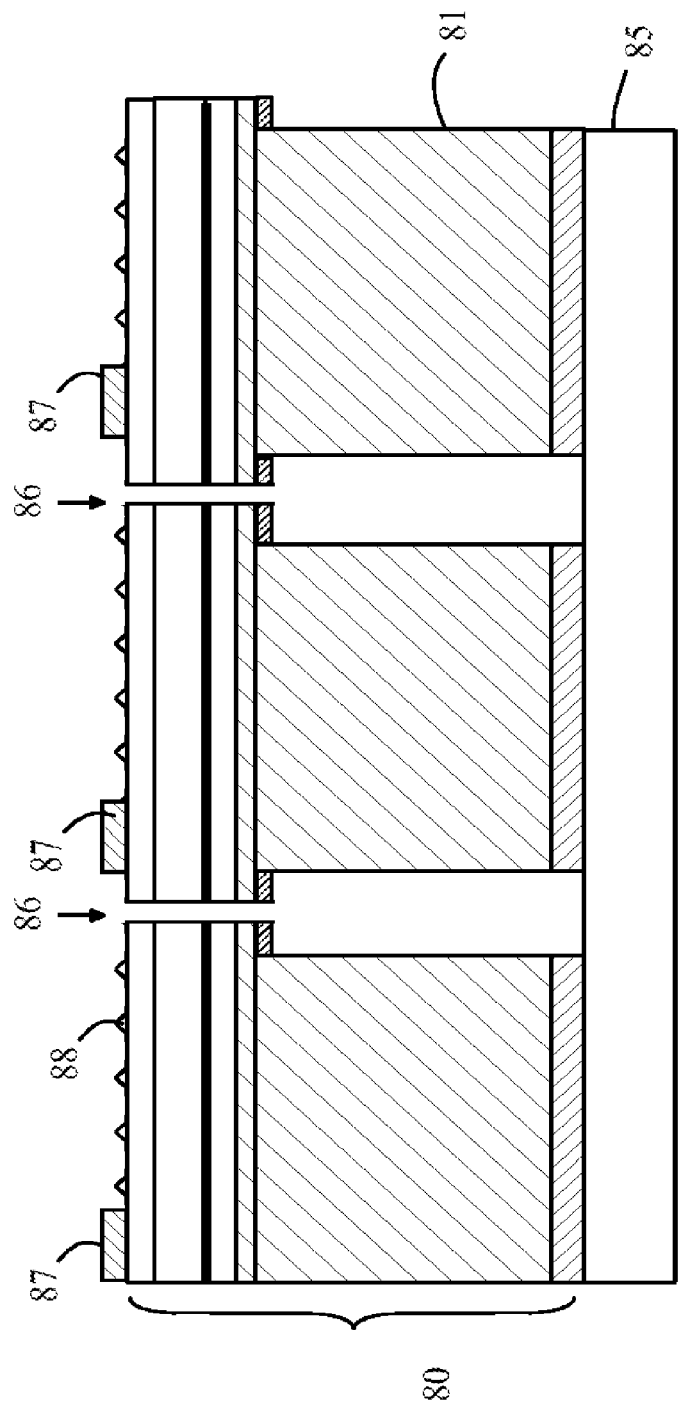

Structure 80 shown in FIG. 8 is then bonded to a second substrate 85 as shown in FIG. 9, which is a cross-sectional view of structure 80 after bonding to substrate 85 and removing growth substrate 51. The top surface of the exposed n-layer is then roughened as shown at 88, and electrical contacts 87 are formed on the n-layer. Finally, trenches 86 are cut through the LED layers down to the gap between the copper metal layers. The individual dies, can then be released by heating the structure to remove substrate 85.

It should be noted that substrate 85 can be any of a variety of materials. Substrate 85 merely acts as a carrier for the individual dies during the process in which the growth substrate is removed and the final fabrication steps that provide the roughened surface and contacts are performed. The bond between substrate 85 and metal pads 81 must be sufficient to withstand the processing conditions encountered in these steps and in the subsequent trench etching step that provides trenches 86. Again, silicon wafers are particularly attractive candidates for carrier 85 as conventional fabrication lines are set up to handle such wafers. It should be again noted that the quality of silicon wafer required is substantially less than the quality of wafers used in the growth of the various LED layers. In addition, it should be noted that the silicon wafer 85 could be reused after it is separated from the rest of the structure, provided the separation process does not destroy the wafer.

In the above-described embodiments, the precursor carrier is segmented into individual dies that include one LED. However, the light sources divided from the precursor carrier could include a plurality of LEDs connected in a series, parallel, or combination thereof.

The above-described embodiments of the present invention have utilized GaN-based light emitting devices. It should be noted that a GaN layer described above could be constructed from other members of the GaN family of materials. For the purposes of this discussion, the GaN family of materials is defined to be all alloy compositions of GaN, InN and AlN. The term GaN is defined to include any member of the GaN family of materials. However, embodiments that utilize other material systems and substrates can also be constructed according to the teachings of the present invention.

The above-described embodiments utilize eutectic metals for bonding the light emitting structure to the structures that provide the mechanical strength needed to support the light emitting structures in the final light sources. The bonding materials should be chosen such that the bonding temperature will not cause degradation of the device performance. In one aspect of the present invention, the materials are chosen such that the bonding temperatures are less than 350° C. In one aspect of the invention, the eutectic metal is chosen from the group consisting of AuSn, AuGe, AlGe, AuIn, or SnAgCu.

While the above-described embodiments utilize eutectic bonding, other bonding methods could be utilized. For example, the structures could be bonded using thermal compression bonding in which each structure includes the same type of metal surface. Compression bonding of substrates using Au to Au, Cu to Cu, or other metals are known to the art.

In the above-described embodiments, the mirror layer is deposited directly on the p-GaN surface of the light-emitting structure. As such, the mirror acts both as a mirror and a current spreading layer that compensates for the high electrical resistance of the p-GaN material. The preferred mirror layer material is silver. If the roughness of the surface of the underlying p-GaN material is too great, the reflectivity of the silver layer is substantially reduced due to the surface plasmon effect. Hence, in some embodiments, it may be useful to provide a transition layer between the p-GaN surface and the silver layer. The transition layer can be constructed from a dielectric such as spin-on-glass, which, when correctly deposited provides a surface which is sufficiently smooth to assure that a silver layer deposited on that surface will have a reflectivity greater than 90 percent.

Unfortunately, such a dielectric layer would interfere with the p-contact function provided by the mirror layer. To provide the p-contact function, vias must be created in the dielectric layer to connect the mirror layer to the p-GaN layer. The density of such vias needs to be sufficient to provide sufficient current spreading in spite of the high resistivity of the p-GaN. Alternatively, a layer of a transparent conductor such as indium tin oxide (ITO) can first be deposited on the p-GaN surface to provide the spreading function so that a lower density of vias is required. The dielectric layer is then deposited over the ITO layer. The silver layer is then deposited over the dielectric layer and connected to the ITO layer by vias in the dielectric layer.

Figure 10:
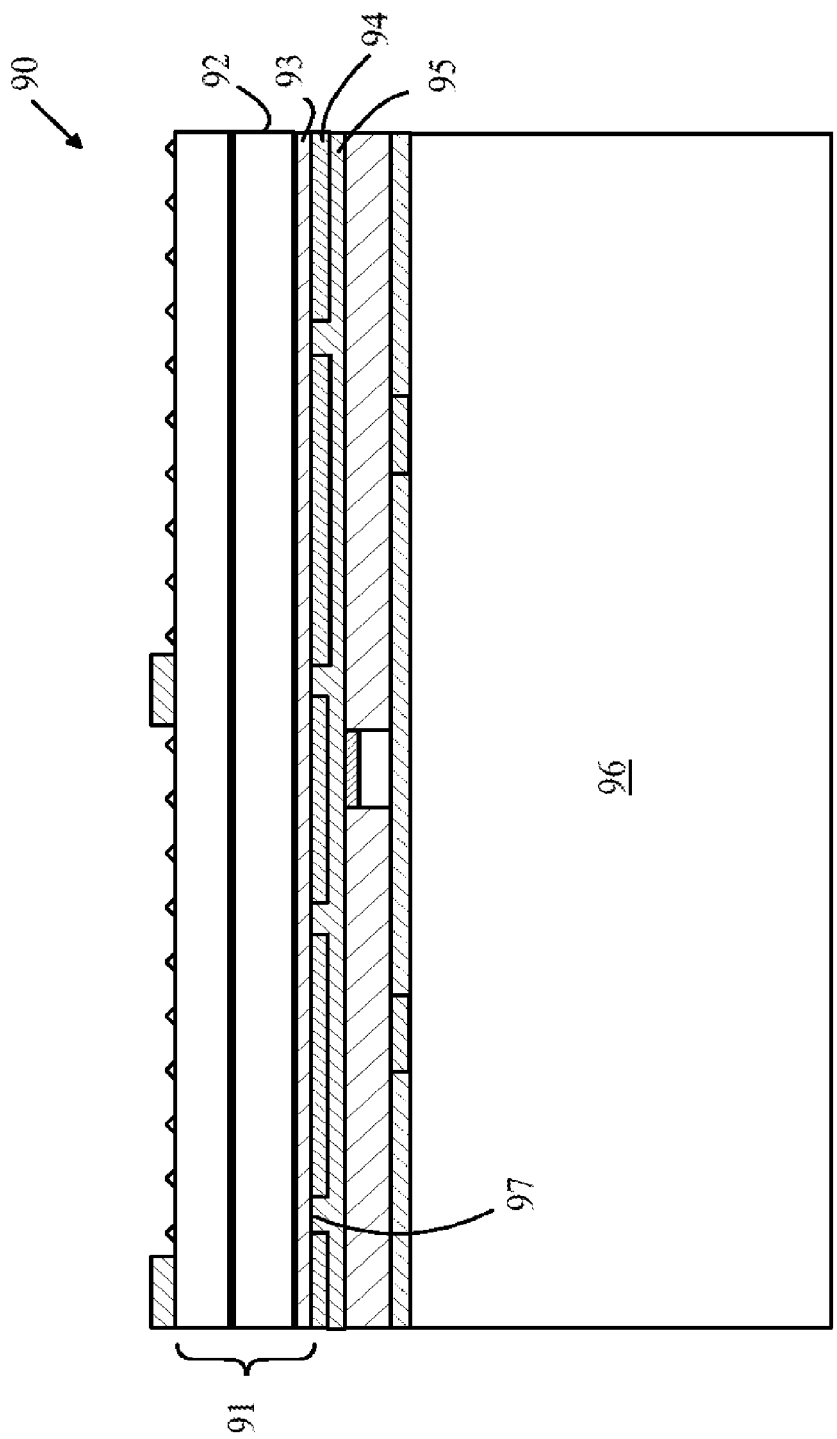
FIG. 10 is a cross-sectional view of a portion of precursor carrier that utilizes a dielectric layer to improve the reflectivity of the mirror

Refer now to FIG. 10, which is a cross-sectional view of a portion of precursor carrier 90 that utilizes a dielectric layer to improve the reflectivity of the mirror. Carrier 90 is analogous to carrier 20 shown in FIG. 1 in that a light emitting structure 91 that includes a p-GaN layer 92 has been transferred to a new substrate 96. An ITO layer 93 is included in the light emitting structure to provide a current spreading layer. A dielectric layer 94 having vias 97 is deposited over ITO layer 93. The mirror layer 95 comprising a layer of silver is deposited on the dielectric layer such that the layer extends through the vias to make contact with ITO layer 93.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A device comprising:
   a structure including a first semiconductor layer, a second semiconductor layer, a light emitting layer formed between said first semiconductor layer and said second semiconductor layer, and a reflective layer formed on a first surface of said second semiconductor layer that is opposite to a second surface in contact with said active layer, a first edge defining a lateral size of said structure; and
   a base member including a substrate and a bonding layer formed on said substrate, said structure formed in contact with said bonding layer, a second edge defining a lateral size of said base member,
   wherein a lateral size of said reflective layer is substantially equal to a lateral size of said active layer, and
   said first edge at said reflective layer and said second edge at said bonding layer are formed having a difference in level so that a lateral size of said bonding layer is smaller than said lateral size of said reflective layer by at least said difference in level between said first edge at said reflective layer and said second edge at said bonding layer.

2. The device of claim 1, wherein said base member has a first surface in contact with said reflective layer, a lateral size of said first surface of said base member being substantially equal to said lateral size of said reflective layer.

3. The device of claim 2, wherein said base member has a lateral size at a location distal from said first surface of said base member smaller than said lateral size of said first surface of said base member.

4. The device of claim 1, wherein said light emitting layer emits light of a predetermined wavelength, and said first layer comprises an n-GaN layer with a surface that includes scattering features having a dimension greater than said predetermined wavelength.

5. The device of claim 1, wherein said base member has a thickness greater than 100 µm.

6. The device of claim 1, wherein said base member comprises an electrical conductor.

7. The device of claim 1, wherein said substrate comprises crystalline silicon.

8. The device of claim 1, wherein said base member comprises a metal.

9. The device of claim 8, wherein said metal is copper or nickel.

10. The device of claim 1, further comprising a dielectric layer formed between said second semiconductor layer and said reflective layer, said dielectric layer having vias.

11. The device of claim 1, wherein said base member includes an insulating pad, and said base member has a first surface in contact with said reflective layer, said first surface of said base member including a surface of said insulating pad and a surface of said bonding layer.

12. The device of claim 1, wherein said substrate has a first surface upon which said bonding layer is formed, said first surface of said substrate is smaller than said lateral size of said reflective layer, said substrate having a lateral size at a location distal from said first surface of said substrate smaller than said lateral size of said first surface of said substrate.

13. The device of claim 1, wherein said bonding layer is a eutectic metal layer.

14. The device of claim 13, wherein said base member includes an insulating layer between said eutectic metal layer and the substrate.

15. The device of claim 1, further comprising a transparent conductive layer formed between said second semiconductor layer and said reflective layer.

16. The device of claim 10, further comprising a transparent conductive layer formed between said second semiconductor layer and said reflective layer, wherein said reflective layer is in electrical contact with said transparent conductive layer through said vias.

17. The device of claim 15, wherein said transparent conductive layer is an ITO layer.

18. The device of claim 16, wherein said transparent conductive layer is an ITO layer.

19. The device of claim 1, said difference in level is formed in a step form.

* * * * *